United States Patent [19]

Watanabe

[11] Patent Number: 5,450,366
[45] Date of Patent: Sep. 12, 1995

[54] IC MEMORY CARD

[75] Inventor: Tadakatsu Watanabe, Itami, Japan

[73] Assignee: Mitsubishi Denki Kabushiki Kaisha, Tokyo, Japan

[21] Appl. No.: 289,549

[22] Filed: Aug. 12, 1994

[30] Foreign Application Priority Data

Aug. 23, 1993 [JP] Japan .................................. 5-207784

[51] Int. Cl.⁶ .............................................. G11C 11/40
[52] U.S. Cl. ........................ 365/230.01; 365/230.03
[58] Field of Search ............... 365/182, 185, 186, 187, 365/226, 227, 230.01, 189.01, 230.03, 230.06, 230.08, 189.05

[56] References Cited

U.S. PATENT DOCUMENTS 5,229,963 7/1993 Ohtsuka .................. 365/185

Primary Examiner—Terrell W. Fears
Attorney, Agent, or Firm—Leydig, Voit & Mayer

[57] ABSTRACT

An IC memory card includes a common memory having memory ICs, each memory IC storing program data; an address bus; a data bus connected to the common memory; a decoder for outputting a chip select signal to the one of the memory ICs corresponding to an address signal input through the address bus and for outputting an error signal when no such memory IC exists; and a read device for reading out program data stored in the memory IC designated by a chip select signal output by the decoder and for outputting predetermined invalid data upon output of the error signal by the decoder.

8 Claims, 7 Drawing Sheets

FIG. 2

| | UPPER BOUND OF SELECTABLE MEMORY IC | UPPER ADDRESS SIGNAL | | MEMORY IC TO BE SELECTED |
|---|---|---|---|---|
| | | DECIMAL | BINARY | |
| PRIOR ART UPPER ADDRESS SIGNAL (3BITS) | $2^3 = 8$ | 0 | 000 | $S_1$ |
| | | 1 | 001 | $S_2$ |
| | | ~ | ~ | ~ |
| | | 7 | 111 | $S_8$ |
| EMBODIMENT UPPER ADDRESS SIGNAL (9BITS) | $2^9 = 512$ | 0 | 000000000 | $S_1$ |
| | | 1 | 000000001 | $S_2$ |
| | | ~ | ~ | ~ |
| | | 6 | 000000110 | $S_7$ |
| | | 7 | 000000111 | NONE |
| | | ~ | ~ | ~ |
| | | 510 | 111111110 | NONE |
| | | 511 | 111111111 | $S_8$ |

IC MEMORY CARD

BACKGROUND OF THE INVENTION

1. Field of the Invention

The present invention relates to an IC memory card, and, more particularly, to a security function for protecting the data stored in the memory card.

2. Description of the Related Art

As one of the portable semiconductor memory devices, an IC memory card is provided. An IC memory card includes semiconductor storage elements in the form of a card. The IC memory card is mounted to a terminal device such as a personal computer, etc. and widely used as external storage for the terminal device.

FIG. 6 is a perspective view of a conventional IC memory card which follows the standards of Japan Electronic Industry Department Association (hereinafter referred to as "JEIDA"). It shows an IC memory card 1 and a connector 30. A double line of socket contacts 31 with tens of terminals per one line thereof are arranged on the end face of the connector 30. The socket contacts 31 are slots perpendicular in a vertical direction to the end face of the connector 30. The socket contacts 31 include therein terminals electrically connected to semiconductor storage elements in the IC memory. The IC memory card constructed as described above is mounted on the terminal through the connector 30, and electrode terminals projecting on the terminal device connector are fitted to the socket contacts 31 in one-to-one correspondence, and the electrode terminals of the terminal device are thereby electrically connected to the IC memory card, thereby making it possible to pass data between the terminal device and the IC memory card. According to the JEIDA standards, the number of terminals of the connector 30 is 68 at contact pitch of 1.27 mm when the IC memory card 1 has the standard dimensions (54.0 mm×85.6 mm ×3.3 mm).

A common memory for storing an application program, and an attribute memory for storing attribute data of the card 1 (data such as kind, configuration, and capacity of the memory) are provided inside the IC memory card. The common memory is usually a plurality of memory ICs, for example, eight memory ICs $S_1$–$S_8$ each having a storage capacity of 128 Kbytes to form a memory space of totalling 1 Mbyte.

FIG. 7 shows a conceptual memory map of the common memory. Page addressing is adopted to this IC memory card. For example, one of the eight memory ICs ($S_1$–$S_8$) is selected by decoding a 3-bit upper address signal among the 20-bits of the address bus, and the address of the memory IC is selected by a 17-bit lower address signal. In this way, the memory IC has a consecutive memory space from upper address 0-lower address 0 to upper address ($2^3$-1)-lower address ($2^{17}$-1). The storage capacity of each of the memory ICs ($S_1$–$S_8$) is 128 Kbytes. Thus, the memory space of the common memory 2 has a storage capacity of 1 Mbyte (128 Kbytes×8.)

A method of copying the application data written in such a memory space will be described. FIG. 8 shows a terminal device for copying an IC memory card in which the application data is written (hereinafter referred to as "master card") to an IC memory card having the same or more storage capacity than that of the master card (hereinafter referred to as "copy card".) It shows card slots 15 and 16 which are insertion slots of the master card and the copy card.

First of all, the master card is inserted into the card slot 15 and the copy card is inserted into the card slot 16. Then, a copy command is input from a keyboard of the terminal device. The terminal device reads out the application program written in the master card from the leading address of the memory space of the master card, and writes it in the leading address of the copy card in accordance with read or write operation as described above. This operation is repeated up to the end address of the master card to produce the copy card having the same contents as that of the master card. Such a copying as described above may be easily operated by a copy command of commercially available software for the terminal device.

The application program of the copied IC memory card may be loaded by input of an execution command from the terminal device in the same manner as in the master card. When the application program is executed, the terminal device reads the contents of address to be accessed first, and decodes the application program written in the address and executes the program. And then, based on the result of the decoding, the terminal device reads out, decodes and executes the application program to be accessed next. These operations are repeated to execute the application program.

Conventionally, an IC memory card constructed such that data of the master card cannot be easily read out has been produced. For example, an IC memory card including therein a secret number memory 17 and a collating circuit 18, as shown in FIG. 9 has been produced. Such an IC memory card is inserted into the card slot when copying the data stored therein, and then the secret number 19 is input from the terminal device before reading out the contents of the IC memory card. The secret number 19 and data previously stored in the secret number memory 17 in the IC memory card are collated by the collating circuit 18, and a gate circuit 30 is opened only when they agree with each other. In this way, a communication path 20 is opened and the contents of a data memory 21 are read out to the terminal device.

However, when the secret number of the IC card as described above is leaked in some way, a copy card having a storage capacity of 1 Mbyte or more, which is applicable to the master card and the JEIDA standards and is widely used makes it possible to copy the application program.

The conventional IC memory card constructed as described above has the following problems: an executable copy card may be easily produced; it is difficult to hold the secret of the application program stored in the IC memory card; and a copyright in the program maybe infringed.

SUMMARY OF THE INVENTION

Accordingly, in order to overcome the above problems, an object of the present invention is to provide an IC memory card capable of preventing leakage of the application program.

According to the present invention, there is provided an IC memory card comprising a common memory having a plurality of memory ICs each storing program data; an address bus; a data bus connected to the common memory; a decoder for outputting a chip select signal to any one of the memory ICs of the common memory corresponding to an address signal input through the address bus and for outputting an error signal when no such memory IC exists; and read means for reading out program data stored in the memory IC of the common memory designated by a chip select signal upon output of the select signal from the decoder, and outputting a predetermined invalid data to the data bus upon output of the error signal from the decoder.

BRIEF DESCRIPTION OF THE DRAWINGS

FIG. 2 is a view showing a method of decoding in an embodiment according to the present invention;

DESCRIPTION OF THE PREFERRED EMBODIMENTS

Figure 1:
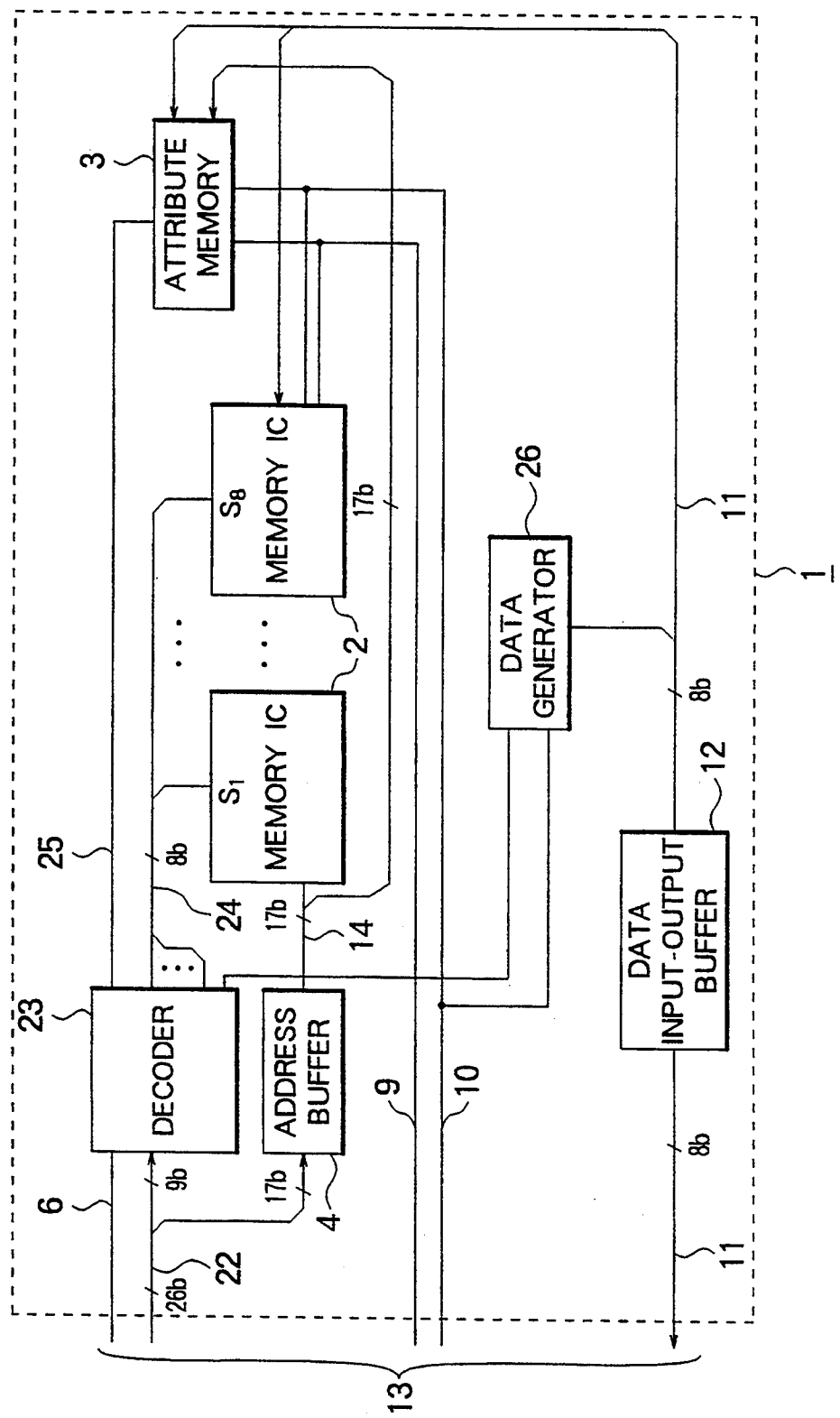
FIG. 1 is a block diagram showing an embodiment of the IC card according to the present invention.

FIG. 1 is a block diagram showing an inner configuration of an IC memory card 1 having, for example, a 8-bit word length and a storage capacity of 1 Mbyte. In the IC memory card 1, a common memory 2 including eight memory ICs ($S_1$–$S_8$) each having a storage capacity of 128 Kbytes stores application program data. An attribute memory 3 including a memory IC having, for example, 8 Kbytes of storage capacity stores attribute data (data such as kind, configuration, and capacity of the common memory.) An address buffer 4 holds a 17-bit lower address signal input from a terminal device (not shown) through 26 bits of address bus 22, and outputs the lower address signal to the 17-bit lower address signal line 14 at a predetermined time. The lower address signal line 14 is connected to the common memory 2 and the attribute memory 3 to show lower addresses of the memory ICs ($S_1$–$S_8$) of the common memory 2 and the memory IC of the attribute memory 3. A memory select signal line 6 transmits a select signal generated at the terminal device selecting either the common memory 2 or the attribute memory 3 to a decoder 23. The decoder 23 outputs a chip select signal for selecting a desired memory IC among the eight memory ICs ($S_1$–$S_8$) of the common memory 2 and the attribute memory 3 to a chip select signal line 24 or 25 based on the upper address signal (9-bit) input through the address bus 22 and the memory select signal input through the memory select signal line 6. When the memory select signal selects the attribute memory 3, the decoder 23 selects the attribute memory 3 independent of the address signal.

When the decoder 23 selects the common memory 2 and no memory IC corresponding to the input upper address signal exists, the chip select signal line outputs "H". A write control signal line 9 transmits a signal which controls writing of data generated by the terminal device, to the common memory 2 and the attribute memory 3. A read control signal line 10 transmits a signal which controls reading of data generated by the terminal device, to the common memory 2 and the attribute memory 3. A data input-output buffer 12 controls timing of data input from and output to the terminal through 8-bit data bus. The address bus 22, the data bus 11, the memory select signal line 6, the write control signal line 9, the read control signal line 10 and a group of other control signal lines (not shown) are connected to connector (not shown) as an interface bus 13. Mounting of the connector on the terminal device makes it possible to pass data between the IC memory card and the terminal device.

A data generator 26 is connected to the decoder 23 and the read control signal line 10, and outputs of the data generator 26 are connected to the data bus 11. The decoder 23 outputs a command signal to the data generator 26 when no memory IC corresponding to the input upper address signal exists, and the data generator 26 outputs "1" to each bit of the data bus 11 when the data generator 26 receives the command signal from the decoder 23 upon read operation.

According to JEIDA standards, 26 bits are assigned to the address signal line in an IC memory card having a storage capacity of 64 Mbytes. However, since an IC memory card having a storage capacity of 64 Mbytes does not yet exist, there are some idle pins in the connector having 68 terminals of the present IC memory card. For example, in the prior art as described above, since only 20 bits of the address signal line are used, there are 6 idle pins. According to this embodiment, the apparent memory space of the common memory 2 may be enlarged by utilizing these idle pins.

The above-described matter will be described in detail. FIG. 2 shows decoding functions of the conventional IC memory card and the IC memory card of this embodiment shown in FIG. 1. It shows a case in which the decoder 23 selects the common memory 2, that is to say, a case in which a memory select signal output to the memory select signal line 6 is at a level for selecting the common memory 2. In the conventional decoder, addresses 0 through 7 may be addressed by a 3-bit upper address signal. Thus, the address signal selects the eight memory ICs ($S_1$–$S_8$) in one-to-one correspondence. In other words, such an IC memory card has a memory space with consecutive addresses. To the contrary, according to this embodiment, addresses 0 through 511 may be addressed by a 9-bit address signal. Thus, the address signal does not select the eight memory ICs ($S_1$–$S_8$) in one-to-one correspondence. That is, when the address signal is input to addresses 0 through 6, the address signal selects the memory ICs ($S_1$–$S_7$) in one-to-one correspondence. When the address signal is input to addresses 8 through 510, the address signal selects no memory ICs. And, when the address signal is input to address 511, it selects the memory IC ($S_8$). That is to say, the substantial storage capacity of the IC memory card according to this embodiment is quite the same as that of the conventional IC memory card. However, since the IC memory card according to this embodiment has a memory space with non-consecutive addresses, the apparent memory space looks larger than that of the conventional IC memory card.

Read and write operation of the IC memory card constructed as described above will be described. In a write operation, the memory select signal line 6 is set to "H" level or "L" level by a memory select signal generated at the terminal device, and the common memory 2 or the attribute memory 3 is selected, respectively. When the memory select signal 6 is at "L" level, the attribute memory 3 is selected regardless of the address signal. In the decoder 23, a chip select signal is generated based on a 9-bit upper address signal input through the address bus 22. As shown in FIG. 2, however, since there is no memory IC corresponding to the upper addresses 7 through 510 in the IC memory card 1, the address which causes writing of data is limited to the upper addresses 0 through 6 and 511.

When the 9-bit upper address signal designating any one of upper addresses 0 through 6 and 511 is input to the decoder 23, the decoder 23 selects one of the memory ICs designated by the address signal by means of the 8-bit chip select signal line 24. At this time, a 17-bit lower address signal input through the address bus 22 is output from the address buffer 4 to the lower address signal line 14 to show the lower addresses of the memory ICs ($S_1$–$S_8$) of the common memory 2 and those of the memory IC of the attribute memory 3, thereby determining an address in the selected memory IC. When the read control signal line 10 is set to "H" level and the write control signal line 9 is set to "L" level, the data input from the data bus 11 through the data input-output buffer 12 is retained in the address corresponding to the selected memory ICs ($S_1$–$S_8$).

When the upper address signal input to the decoder 23 designates the upper addresses 7 through 510, the decoder 23 outputs a chip select signal having each bit at "L" level to the chip select signal line 24. No memory IC is selected and writing of data cannot be carried out.

The read operation will be described. In the same manner as that in the write operation, one of the memory ICs ($S_1$–$S_8$) is selected, the selected memory IC is addressed, the read control signal line 10 is set to "L" level and the write control signal line 9 is set to "H" level. Then, data is read out from the pertinent address of the desired memory ICs ($S_1$–$S_8$). The data is output to the external terminal device through the data buffer 12. However, when the upper address signal input into the decoder 23 designates the upper addresses 7 through 510, the decoder 23 outputs a chip select signal having each bit at "L" level to the chip select signal line 24 and a command signal to the data generator 26. Data "1" is forcibly output from the data generator 26 to each bit of the data bus 11.

Since the specification of the IC memory card of this embodiment is special one, the specification may be written in the attribute memory 3. The terminal device accesses the attribute memory 3 before accessing the common memory 2 of the IC memory card. Thus, attribute data the IC memory card is supplied to the terminal device, thereby effectively operating writing and reading of data.

Figure 3:
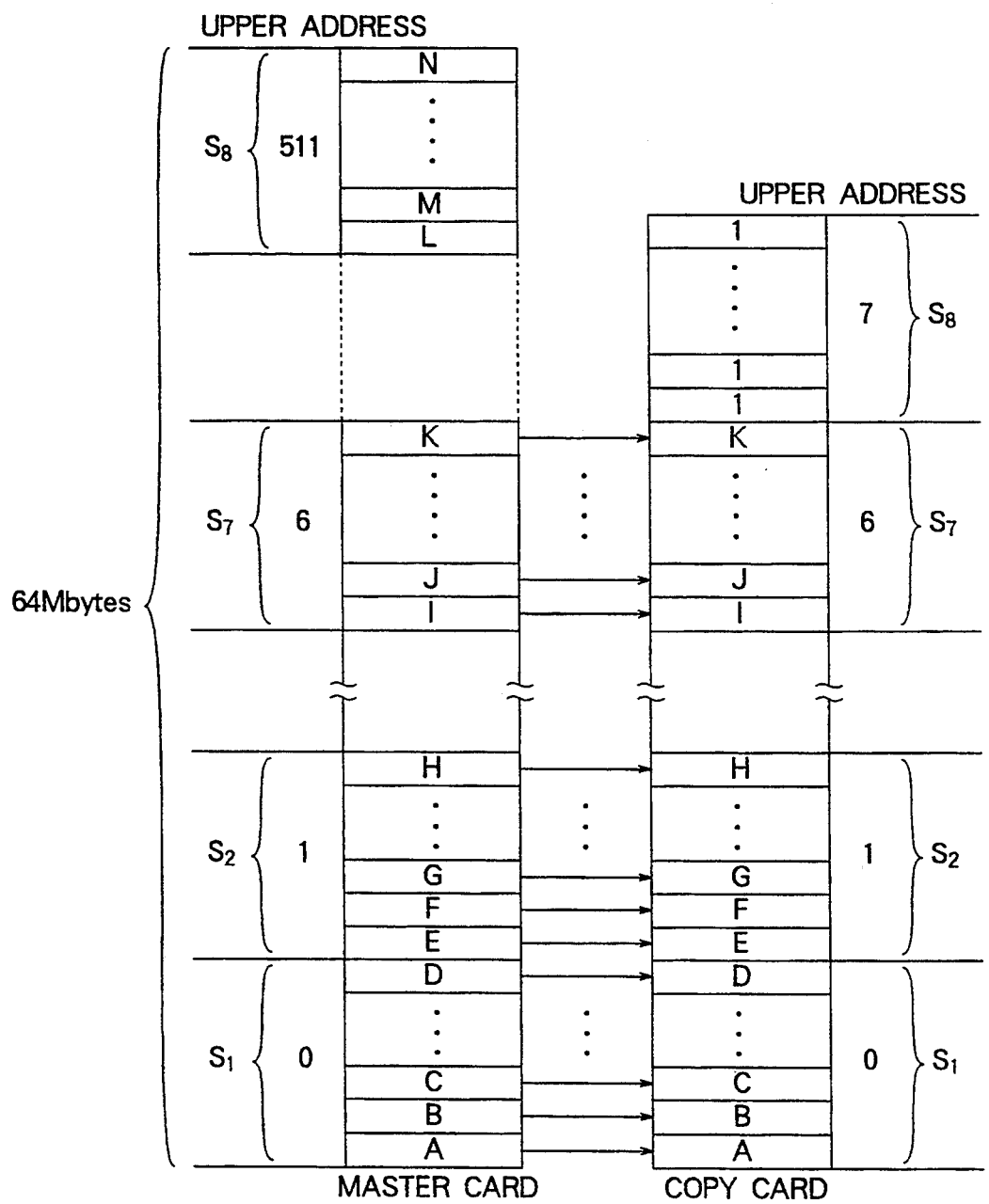
FIG. 3 is a view showing a memory space map of the IC memory card in an embodiment according to the present invention.

Copying the application program written in the IC memory card (master card) in a write operation as described above for the conventional copy card will be described. FIG. 3 shows reading data from a memory map of the master card and copying the data to a memory map of the copy card. A series of actions is performed using the terminal device. In the master card, since the address 511 is the upper end address, the apparent memory space is 64 Mbytes (128 Kbytes×512) because the storage capacity of one of the memory ICs ($S_1$–$S_8$) is 128 Kbytes. Therefore, since the data written in the upper address 511 cannot be addressed in the address 511 in the copy card, copying the data to the copy card becomes impossible, although reading the data in the order of addresses and copying the data to the copy card are repeated as before. That is to say, the address 511 becomes a secret area of the master card. When the address 7 is designated to the master card, all of the data are forcibly output as "1". Thus, invalid data is written in the address 7 in the copy card.

Figure 4:
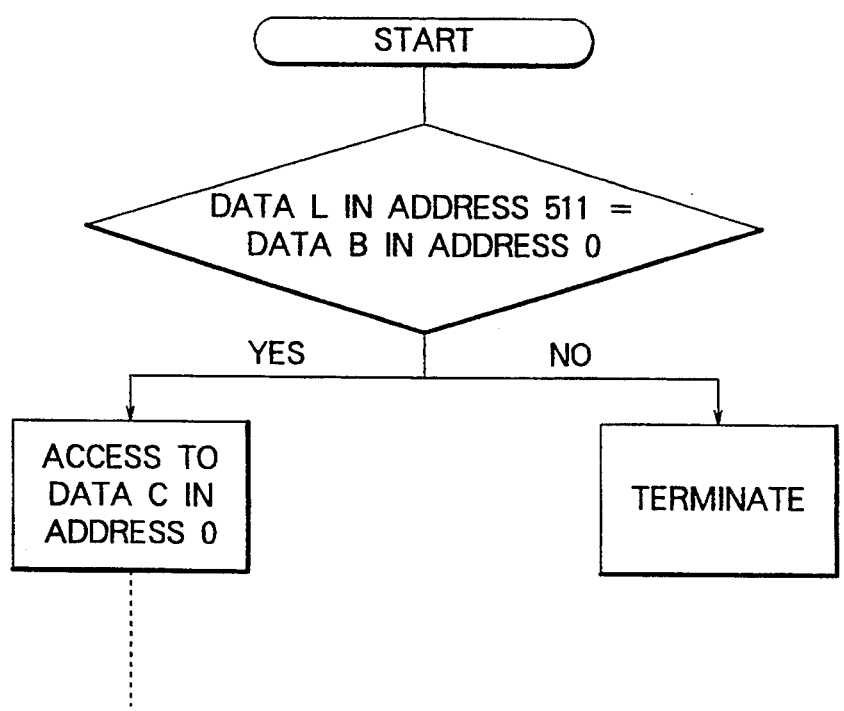
FIG. 4 is a flow chart showing an execute sequence of application data in an embodiment according to the present invention.

The execution of the copied IC memory card will be described. FIG. 4 is a flow chart showing an execute sequence of the application program data written in the master card shown in FIG. 3. When the application program is executed with the master card, an address read out first from the terminal device is determined. For example, data A in the upper address 0 is read out first. By decoding the data A with the terminal device, the contents of the data A, "If the data L in the upper address 511 is equal to the data B in the upper address 511, access to the data C in the upper address 0. If not equal, terminate the program." can be learned. Before the execution, data designating the upper address 511, which does not exist in the present IC memory card, is written in the data A. The terminal device reads out the data L of the upper address 511 and the data B of the upper address 0 and collates these data L and B. When data L agrees with data B, the terminal device accesses the data C in the upper address 0. When the contents of the data L do not agree with those of the data B, the terminal device terminates the program. That is to say, the application program is executed only when the contents of the data L in the upper address 511 agree with those of the data B in the upper address 0. In executing the application program with the copy card, the data L in the upper address 511 (the secret area of the master card) to be accessed next does not exist even though access to data A in the upper address 0 can be obtained. Thus, the program is terminated at the stage of the access to data A, and the copy card becomes substantially non-executable copy card.

The application program may be a data such that the data to be accessed first designates the upper address 511. For example, the application program itself may be described in the upper address 511.

In order to execute the application program with the copy card, the two methods may be suggested. However, it is very difficult to carry out these methods. One method is to use an IC memory card having a memory IC with larger capacity than the apparent memory space of the master card, as a copy card. However, since the secret area of the master card is set to the value near 64 Mbytes, which is the upper limit value of the storage capacity of the JEIDA standards, a large-capacity IC memory card which does not exist at present is required for copying the master card. Such an IC card cannot be obtained. The other method is to decode the application program. However, it is very difficult to decode the application program because the application program is usually written in machine language.

The IC memory card constructed as described above has a secret storage area which does not exist in any existing IC memory card because the apparent storage capacity is larger than that of any existing IC memory card. Therefore, it is impossible to copy the secret storage area of the IC memory card of this embodiment to an existing IC memory card. According to this embodiment, in order to use such IC memory card effectively, when the application program written in the IC memory card is executed, the contents of data of the program are stored in the secret memory area before execution to obtain access to the secret area first. Thus, when the application program is executed with the copy card, the execution of the program is terminated at the initial stage. Therefore, little leakage of the application program takes place.

Figure 5:
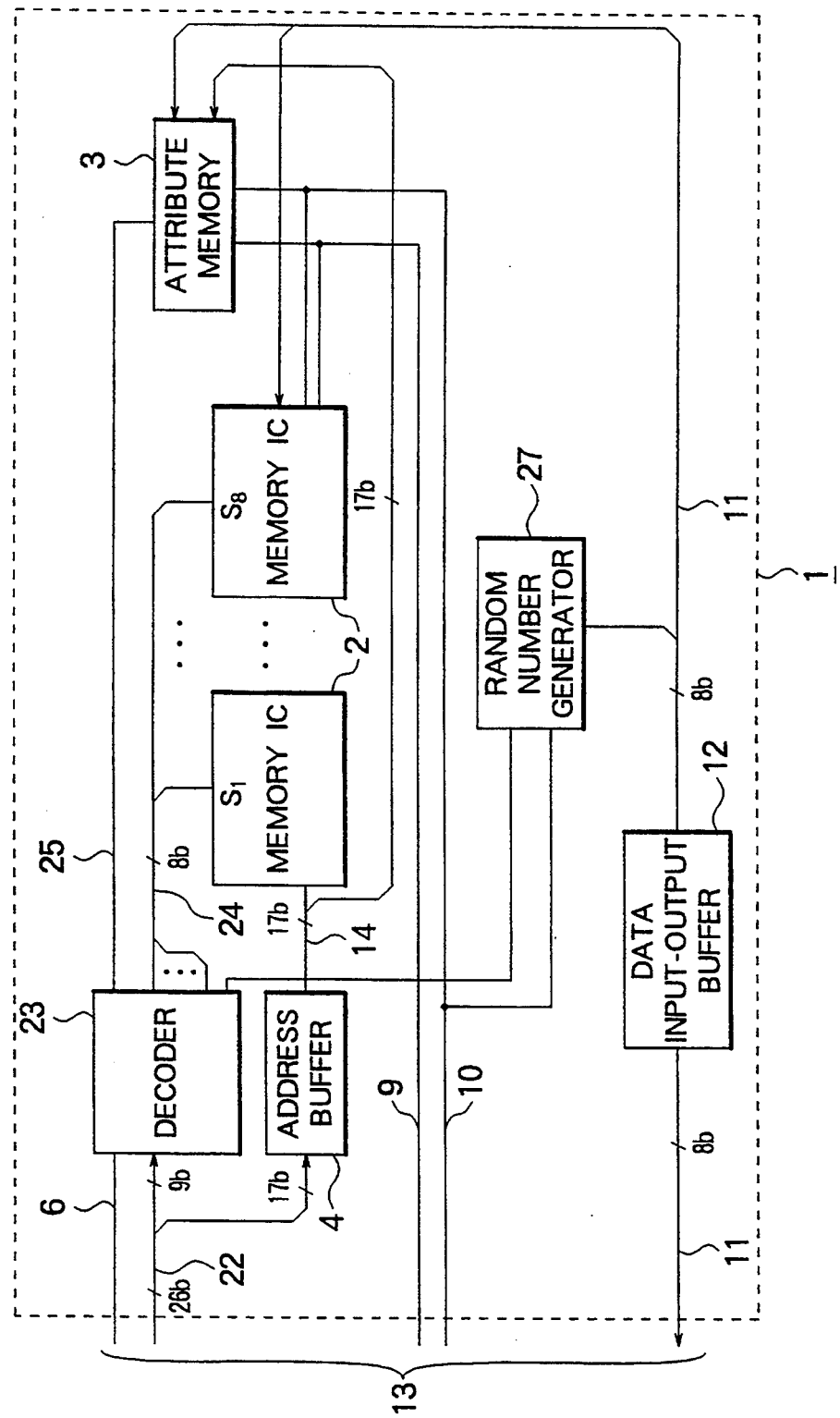
FIG. 5 is a block diagram showing another embodiment of the IC memory card.
Figure 6:
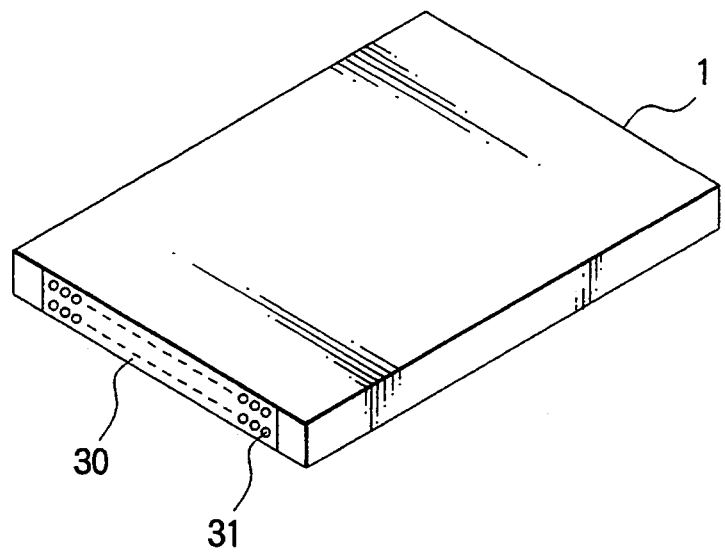
FIG. 6 is a perspective view showing a generally used IC memory card.
Figure 7:
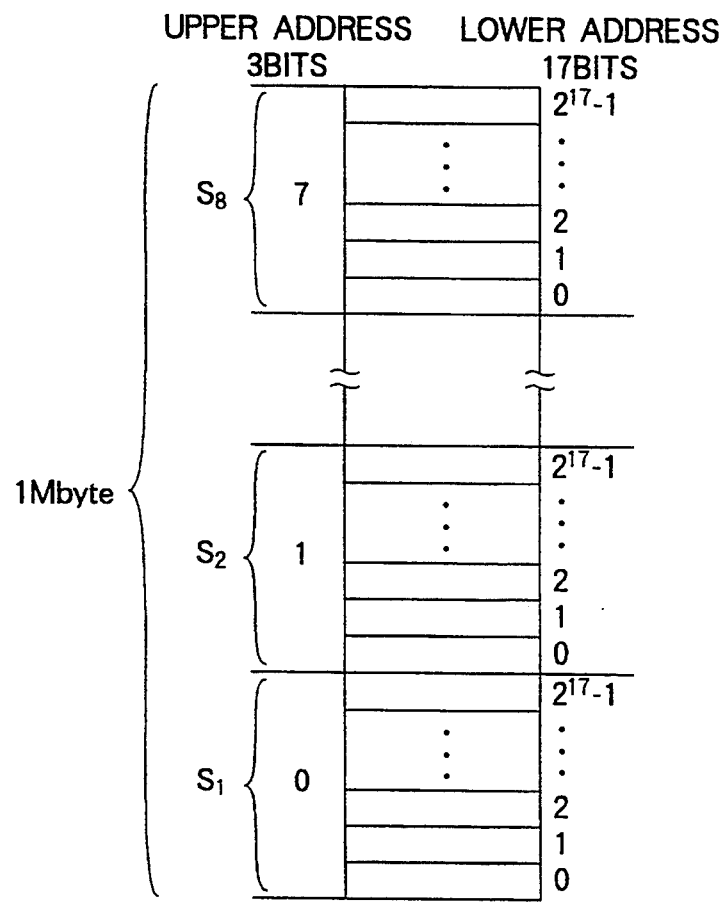
FIG. 7 is a view showing a memory space map of the conventional IC memory card.
Figure 8:
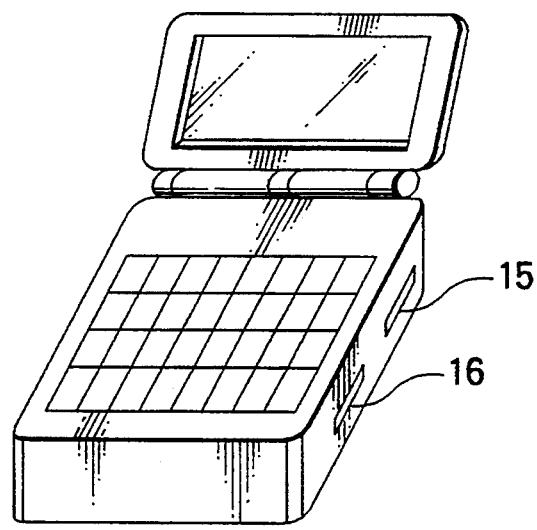
FIG. 8 is a perspective view showing a terminal device into which the IC memory card is inserted.
Figure 9:
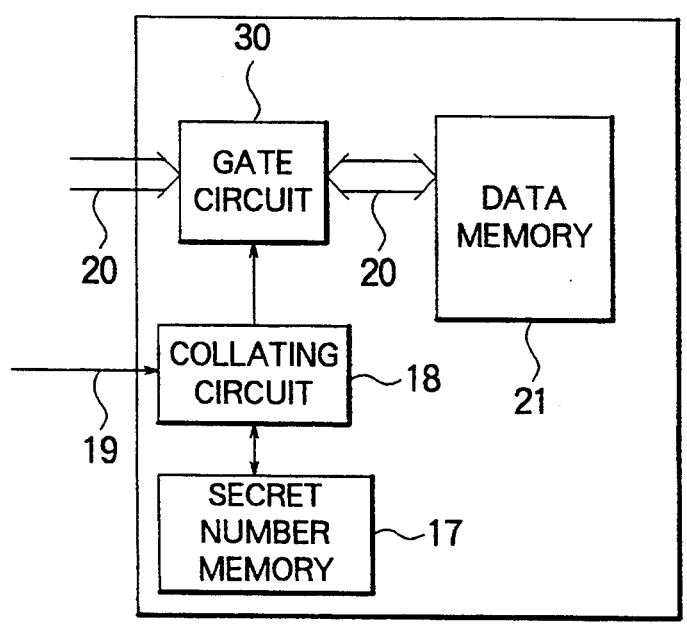
FIG. 9 is a block diagram showing a configuration of the conventional IC memory card.

A random number generator 27 instead of the data generator 26 may be provided, as shown in FIG. 5. With the provision of the random number generator, the random number may be forcibly output to the data bus 11 when the address in which the memory IC does not actually exist is designated, that is to say, when the upper address signal designates the upper address 7 through 510. Therefore, it may be seen that a memory space corresponding to all of the upper addresses 7 through 510 may apparently exist, thereby preventing leakage of the application program more effectively.

According to the embodiment as described above, an IC memory card having 8-bit data bit length, and the eight memory ICs have been described as concrete examples to enhance understanding of the IC memory card. However, the present invention is not limited thereto. For example, the present invention may be applied to an IC memory card having a connector with 88 terminals of the JEIDA standards, and to an IC memory card handling 32 bits of data. And, the secret memory area may be set in the attribute memory. Further, when the IC memory card according to this embodiment is provided with the conventional collating circuit, execution of the master card may become difficult. In addition copying of the data stored in the master card may be prevented. Therefore, such an IC memory card has an excellent security function.

What is claimed is:

1. An IC memory card comprising:
   a common memory having a plurality of memory ICs, each memory IC storing program data:
   an address bus;
   a data bus connected to said common memory;
   a decoder connected to said address bus and said common memory for outputting a chip select signal to the memory IC corresponding to an address signal input through said address bus and for outputting an error signal when no such memory IC exists; and
   read means connected to said decoder and said common memory for reading out program data stored in the memory IC designated by the chip select signal upon output of the chip select signal from said decoder and for outputting predetermined invalid data upon receipt of the error signal from said decoder.

2. The IC memory card according to claim 1 wherein said read means includes:
   a read control signal line connected to said common memory; and
   a data generator connected to said decoder, said data bus, and said read control signal line for receiving a read command through said read control signal line and outputting predetermined invalid data to said data bus upon receipt of an error signal from said decoder.

3. The IC memory card according to claim 2 wherein said data generator outputs "1" as the invalid data.

4. The IC memory card according to claim 2 wherein said data generator outputs a random number as the invalid data.

5. The IC memory card according to claim 1 wherein said decoder decodes an upper address of a predetermined number of bits in an address signal and outputs one of a chip select signal and an error signal in response.

6. The IC memory card according to claim 5 wherein said decoder decodes an upper address having a larger bit number than required for selecting a memory IC.

7. The IC memory card according to claim 5 comprising an address buffer for inputting a lower address of a predetermined number of bits in an address signal to each memory IC.

8. The IC memory card according to claim 1 comprising:
   an attribute memory for storing attribute data of the IC memory card; and
   a memory select signal line for selecting between said common memory and said attribute memory wherein said decoder outputs a select signal to said attribute memory upon selection of said attribute memory and said read means reads out attribute data stored in said attribute memory and outputs the to said data bus.

* * * * *